(12) United States Patent
Theodet

(10) Patent No.: US 11,511,483 B2
(45) Date of Patent: Nov. 29, 2022

(54) METHOD FOR MANUFACTURING AN ARTICLE MADE OF A POLYMERIZED MATERIAL

(71) Applicants: NIKON CORPORATION, Tokyo (JP); Essilor International, Charenton-le-Pont (FR)

(72) Inventor: Manuel Theodet, Tokyo (JP)

(73) Assignees: Nikon Corporation, Tokyo (JP); Essilor International, Charenton-le-Pont (FR)

( * ) Notice: Subject to any disclaimer, the term of this patent is extended or adjusted under 35 U.S.C. 154(b) by 205 days.

(21) Appl. No.: 16/618,521

(22) PCT Filed: Jun. 30, 2017

(86) PCT No.: PCT/IB2017/000976
§ 371 (c)(1),
(2) Date: Dec. 2, 2019

(87) PCT Pub. No.: WO2019/002902
PCT Pub. Date: Jan. 3, 2019

(65) Prior Publication Data
US 2020/0130262 A1    Apr. 30, 2020

(51) Int. Cl.
*B29C 64/135*    (2017.01)
*B33Y 10/00*    (2015.01)
(Continued)

(52) U.S. Cl.
CPC ............ *B29C 64/135* (2017.08); *B33Y 10/00* (2014.12); *B33Y 70/00* (2014.12); *B29K 2063/00* (2013.01); *B33Y 30/00* (2014.12)

(58) Field of Classification Search
CPC .......................... B29C 64/135; B29C 64/106
See application file for complete search history.

(56) References Cited

U.S. PATENT DOCUMENTS 4,148,057 A   4/1979 Jesse
4,752,498 A   6/1988 Fudim
(Continued)

FOREIGN PATENT DOCUMENTS

CN   102301277 A   12/2011
CN   105828984 A   8/2016
(Continued)

OTHER PUBLICATIONS

English translation of JP-11042713-A by EPO. (Year: 1999).*
(Continued)

*Primary Examiner* — Niki Bakhtiari
*Assistant Examiner* — Inja Song
(74) *Attorney, Agent, or Firm* — Nixon & Vanderhye

(57) ABSTRACT

Disclosed is a method for manufacturing an article made of a polymerized material including the steps of: —providing a vat of polymerizable material, transparent at least in the 400-800 nanometers wavelengths range, —irradiating the polymerizable material with a laser beam according to a predetermined pattern so as to polymerize the polymerizable material in order to form the article, the predetermined pattern being determined based on a three-dimension representation of the article with the positions in three dimensions of a plurality of volume units adapted to form together the article, the laser beam scanning the vat in three dimensions in order to be focused at each position of the volume units present in the predetermined pattern so as to initiate locally the polymerization of the polymerizable material at each of these positions.

20 Claims, 3 Drawing Sheets

Figure 5:
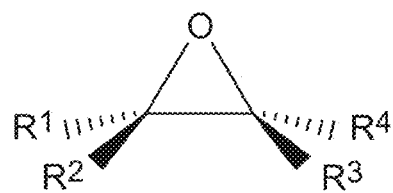

(51) Int. Cl.
   *B33Y 70/00*       (2020.01)
   *B33Y 30/00*       (2015.01)
   *B29K 63/00*       (2006.01)

(56) References Cited

U.S. PATENT DOCUMENTS

| | | | | |
|---|---|---|---|---|
| 5,429,908 | A | * | 7/1995 | Hokuf ............... B33Y 30/00 |
| | | | | 430/269 |
| 5,583,342 | A | | 12/1996 | Ichie |
| 6,001,297 | A | * | 12/1999 | Partanen ............ B29C 64/135 |
| | | | | 264/401 |
| 6,214,276 | B1 | * | 4/2001 | Gelbart ............... G03F 7/2055 |
| | | | | 264/401 |
| 6,432,607 | B1 | * | 8/2002 | Tamura ............... C08F 2/46 |
| | | | | 430/269 |
| 8,845,949 | B2 | * | 9/2014 | Coeck ............... B33Y 30/00 |
| | | | | 264/401 |
| 2006/0222999 | A1 | * | 10/2006 | Miyazaki ............ C08G 59/62 |
| | | | | 430/280.1 |
| 2007/0060682 | A1 | | 3/2007 | Ito et al. |
| 2009/0072447 | A1 | | 3/2009 | Hull et al. |
| 2011/0269865 | A1 | * | 11/2011 | Wu ............... G03F 7/031 |
| | | | | 526/89 |
| 2012/0098164 | A1 | * | 4/2012 | Kan ............... B29C 64/135 |
| | | | | 264/494 |
| 2013/0056910 | A1 | | 3/2013 | Houbertz-Krauss et al. |
| 2015/0088292 | A1 | | 3/2015 | Inoue et al. |
| 2015/0346483 | A1 | | 12/2015 | Ehrmann |
| 2016/0046070 | A1 | | 2/2016 | Mappes et al. |
| 2016/0184931 | A1 | | 6/2016 | Green |

FOREIGN PATENT DOCUMENTS

| | | | | | |
|---|---|---|---|---|---|
| FR | | 2639948 | A1 | 6/1990 | |
| JP | | H05-169551 | A | 7/1993 | |
| JP | | H06-297585 | A | 10/1994 | |
| JP | | 10180881 | A * | 7/1998 | ......... B29C 64/124 |
| JP | | H10-180881 | A | 7/1998 | |
| JP | | 11042713 | A * | 2/1999 | |
| JP | | H11-042713 | A | 2/1999 | |
| JP | | 11170377 | A * | 6/1999 | |
| JP | | H11-170377 | A | 6/1999 | |
| JP | | 2000-143740 | A | 5/2000 | |
| JP | | 2001-121614 | A | 5/2001 | |
| JP | | 2003-001599 | A | 1/2003 | |
| JP | | 4235698 | B2 | 3/2009 | |
| JP | | 2015-058678 | A | 3/2015 | |

OTHER PUBLICATIONS

English translation of JP-10180881-A by EPO. (Year: 1998).*
OA appendix: English translation of JP-11170377-A by EPO. (Year: 1999).*
International Search Report and Written Opinion, dated Jul. 5, 2018, from corresponding PCT application No. PCT/IB2017/000976.

* cited by examiner

Fig.1
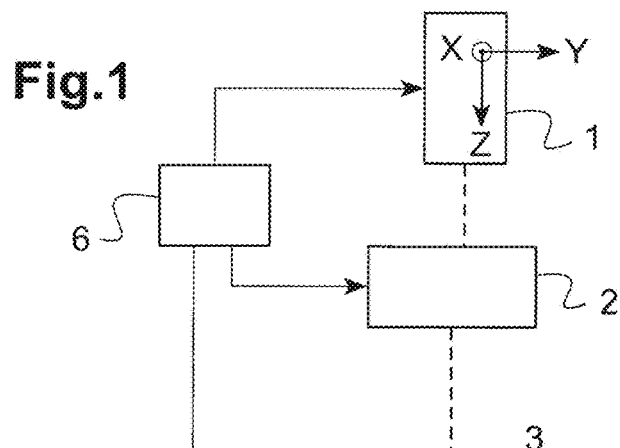
Fig.2
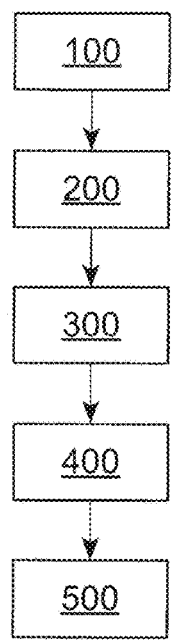
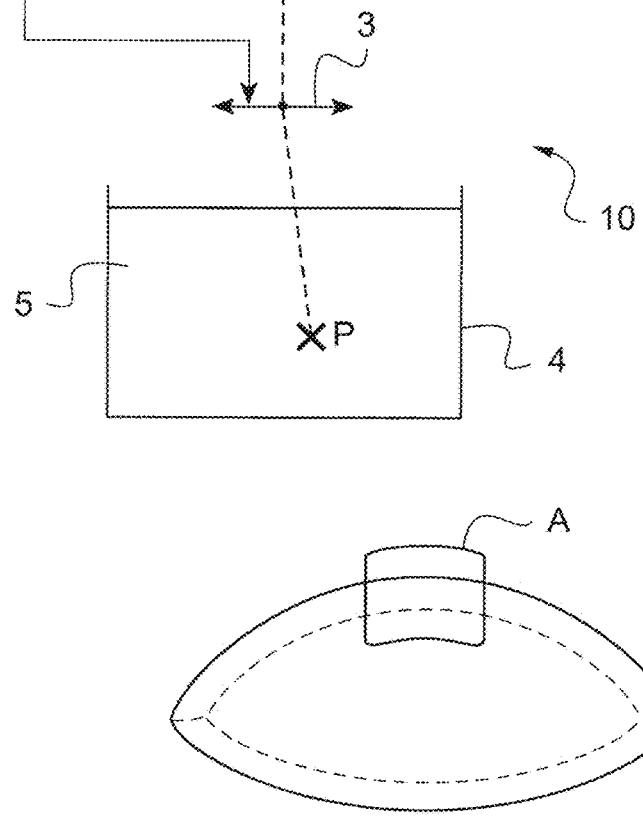
Fig.3
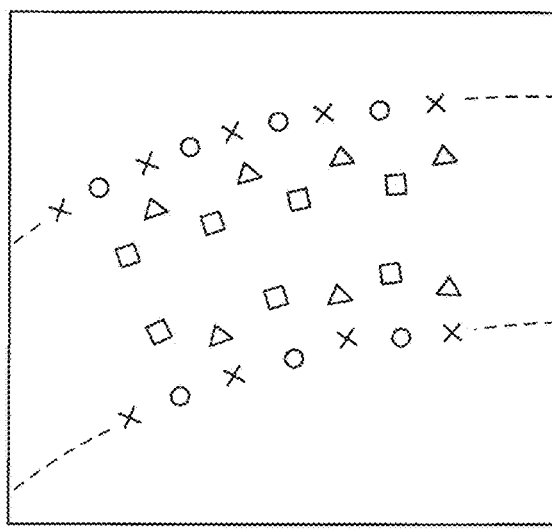
Fig.4

METHOD FOR MANUFACTURING AN ARTICLE MADE OF A POLYMERIZED MATERIAL

TECHNICAL FIELD OF THE INVENTION

The invention relates to a method for manufacturing an article made of a polymerized material.

BACKGROUND INFORMATION AND PRIOR ART

Different methods for manufacturing articles in polymerized material are well known.

Known micro production processes enable high-resolution structuring of arbitrary 3D patterns in photosensitive materials. The polymerization is for example triggered locally by two-photon absorption of a laser beam.

The resolution, i.e., the voxel size, is determined mostly by the laser spot size in the material, the power of the laser source and the properties of the photosensitive material itself.

In order to obtain the shape of the article, the article is built according to a layer-by-layer build process on a substrate that is moved relative to the focusing optics of the laser beam. In a first known implementation, called "fixed-beam moving-sample" (FBMS), the substrate is moved in all three dimensions by a high-precision positioning unit relative to the focusing optics, while the laser is fixed. The movement of the substrate is often driven by piezo actuators that allow for a very precise focus trajectory. In a second known implementation, the laser beam is laterally scanned using galvanometric mirrors, while the substrate is moved vertically, said vertical movement of the substrate being controlled by piezo-actuators.

This known technology is of very high precision and relatively slow. It is rather not adapted to the building of article of size bigger than a few hundreds of micrometers.

SUMMARY OF THE INVENTION

Therefore one object of the invention is to provide a method for manufacturing an article made of a polymerized material in a fast way, adapted to the manufacturing of article of sizes bigger than a few hundreds of micrometers.

The above object is achieved according to the invention by providing a method for manufacturing an article made of a polymerized material comprising the steps of:
  providing a vat of polymerizable material in liquid form, transparent at least in the 400-800 nanometers wavelengths range,
  irradiating said polymerizable material with a laser beam according to a predetermined pattern so as to polymerize said polymerizable material in order to form the article, the predetermined pattern being determined based on a three-dimension representation of said article with the positions in three dimensions of a plurality of volume units adapted to form together said article, the laser beam scanning the vat in three dimensions in order to be focused in the vat at each position of said volume units present in said predetermined pattern so as to initiate locally the polymerization of the polymerizable material at each of these positions.

Thanks to the invention, the vat, that is fixed, is scanned in all three directions by the laser beam. There is therefore no need to use a support adapted to be moved in order to move the article to be manufactured in the XY plane.

Advantageously, the method according to the invention allows for much faster fabrication speed than the known layer-by-layer building processes.

Moreover, there is no need for any support at all. The volume of the article is scanned in the vat at a high frequency, resulting in the polymerization of volume units located in the whole volume of the article in a very short time.

The article is polymerized, and therefore solidifies very quickly inside the vat of polymerizable material.

Said predetermined pattern is a 3D pattern comprising the 3D positions of the volume units (also called voxels) of the vat where the laser beam is to be focused in order to form the article.

The polymerizable materiel located at these 3D positions is irradiated by the laser beam at its waist. This irradiation triggers the photopolymerization of the polymerizable material, thereby forming a volume unit of polymerized material at this 3D position.

The predetermined pattern is determined to obtain the global shape and volume of the article at the end of the process, eventually taking into account the drift of the volume units of polymerized material inside the vat of polymerizable material during the scanning of the laser beam, as described later.

According to other advantageous and non limitative features of the method of the invention,
  during said irradiation step, said laser beam scans the volume of the vat according to a predetermined pathway comprising a succession of said positions of the volume units to be irradiated according to said predetermined pattern, this pathway comprising positions of the volume units to be irradiated that are distant from the positions of all the volume units having been irradiated before following said pathway;
  said irradiation step comprises a predetermined number of successive scanning sequences, during each of which the laser beam scans the vat according to a part of said predetermined pathway, this part comprising the positions of a plurality of volume units positioned in a part of or in the whole volume of the article;
  during at least one of said scanning sequences, at least one volume unit or a cluster of volume units irradiated by the laser beam is not in contact with any other volume unit or cluster of volume units irradiated by the laser beam during the same scanning sequence;
  during a first sequence of said scanning sequences, the laser beams irradiates a first set of volume units of the vat, and, during a further scanning sequence, the laser beams irradiates a second set of volume units, each volume units of the second set of volume units being situated in between a plurality of the volume units of the first set;
  at least one volume unit irradiated by the laser beam during a given scanning sequence was already irradiated by the laser beam during a previous scanning sequence;
  during said irradiation step, said laser beam scans the volume of the vat at a frequency ranging from ten (10 Hz) to hundred thousands (100 kHz) positions of the predetermined pathway per second, preferably from hundred (100 Hz) to fifty thousands (50 kHz) positions, more preferably from ten thousands (10 kHz) to fifty thousands (50 kHz) positions or more (up to 100 thousand (100 kHz) positions)—said irradiation step lasts between 1 second to 30 minutes;

the laser beam is pulsed with pulses lasting between one nanosecond (1 ns) and fifty nanoseconds (50 ns) and has an energy higher than or equal to 10 milliJoules per pulse, or $10^8$ W/cm$^2$;

the laser beam irradiates the polymerizable material with a wavelength adapted to trigger its polymerization, in the 250 to 400 nm range or 1 micrometer to 4 micrometers range;

the polymerization of the polymerizable material is initiated by ionization of at least one molecule of said polymerizable material, resulting from the irradiation by the laser beam;

the polymerizable material comprises molecules of a vinyl-ether component, and/or of an epoxy component, and/or of other material adapted to polymerize with a cationic mechanism;

the polymerizable material comprises, in weight relative to the total weight of said material:
from 85% to 95% of epoxy components,
from 15% to 5% of vinyl-ether components;

the polymerizable material exhibits a viscosity that ranges from 100 to 900 milliPascals seconds (mPa·s);

the polymerizable material exhibits a density that is close to the density of the polymerized material obtained after polymerization;

the difference in density between the polymerizable material before polymerization and the polymerized material obtained after polymerization is less than 10% of the density of the polymerizable material;

during a given scanning sequence, the actual positions in the vat of the volume units of the vat having been irradiated by the laser beam during the previous scanning sequences are determined through measurements and/or calculations;

said predetermined pathway is modified by taking into account the actual positions of the volume units of the vat having been irradiated by the laser beam during the previous scanning sequences;

the change in the positions in the vat of each volume unit of the vat having been irradiated by the laser beam is predicted through calculations, and said predetermined pattern and/or pathway is determined taking into account the change in the position of the volume units of the vat after they have been irradiated by the laser beam, in order for the volume units of polymerized material obtained after irradiation of the polymerizable material by the laser beam to form together said article at the end of the irradiation step.

DETAILED DESCRIPTION OF EXAMPLE(S)

The following description, enriched with joint drawings that should be taken as non limitative examples, will help understand the invention and figure out how it can be realized.

On joint drawings:

FIG. 1 is a schematic view of an embodiment of a device for implementing the invention, FIG. 2 is a schematic representation of the steps of the method according to the invention, FIG. 3 is a schematic view of the article to manufacture, FIG. 4 is a schematic representation of a 3D pathway comprising the position of the volume units to be irradiated by the laser in successive scanning sequences, and, FIGS. 5 to 27 show the developed formulas of molecules that may be part of the polymerizable material.

On FIG. 1, we have represented schematically a device 10 for implementing the method according to the invention.

Device

The device 10 used to implement the method according to the invention comprises a vat 4 of polymerizable material 5 in liquid form and a laser beam generation and scanning system comprising a laser source 1 for emitting a laser beam in a predetermined wavelength range, a scanning device 2 for scanning said laser beam, a focusing optical system for focusing said laser beam on a volume unit P of the vat of polymerizable material having a predetermined position in three dimensions, in order to locally trigger polymerization of the polymerizable material in this volume unit P, and obtain a volume unit of polymerized material at said predetermined position in three dimensions.

The laser beam is generated by the laser source 1 and passes through the focusing optical system 3 before entering the polymerizable material 5. The polymerization of the polymerizable material is triggered locally, only in the area of the waist of the laser beam, that is to say, where the laser beam is focused.

The diameter of the waist of the laser is for example 0.03 millimeter, preferably comprised between 1 micrometer and 200 micrometers, preferably less than 50 micrometers.

The laser source 1 is preferably a high power pulsed laser (200W).

The laser beam is emitted along the optical axis of the laser source 1, corresponding here to a direction OZ of a referential OXYZ attached to the laser source.

The laser beam generation and scanning system also comprises synchronization means for synchronizing laser pulses output by the laser source and scanning timing of said scanning means so that said polymerization is triggered at predetermined instants of a scanning sequence. In other words, the movement of the laser is synchronized with the pulses of said laser in order to trigger the polymerization at adequate predetermined instants of the scanning sequence.

The wavelength range of the laser source 1 comprises at least a wavelength adapted to trigger the polymerization of the polymerizable material contained in the vat. This wavelength range is therefore determined depending on the polymerizable material used.

The laser beam preferably has a wavelength in the invisible region, for example in the 250 to 400 nanometers range or 1 micrometer to 4 micrometers range.

The scanning device 2 comprises a 3D scanner device allowing controlling the direction of the laser beam.

It may comprise for example two mobile mirrors adapted to be rotated around two different rotational axes.

Thanks to the scanning device 2, the focus of the laser may be moved in the OX and OY directions of the referential.

Said focusing optical system 3 may be constituted by a condenser lens or a concave mirror.

The focal distance of the focusing optical system 3 is adjustable in order to modify the distance between the laser source and the focus of the laser.

The focusing optical system 3 comprises for example one or a plurality of condenser lenses.

At least one of these condenser lenses is for example movable along an axis parallel to the optical axis of said laser source 1 so that the distance from the condenser lens to the point where the laser beam is focused is modified.

Alternatively, said focusing optical system may have a condenser lens and an optical element for changing the optical pathway between the condenser lens and the point where the laser beam is focused.

Thanks to the combined action of the scanning device 2 and focusing optical system 3 on the distance of the focus of the laser beam, the position of the focus of the laser beam may be adjusted in the OZ direction of the referential.

Preferably, said laser source is adapted to emit a pulsed laser beam having a pulse width of 50 nanoseconds or less, with a repetition frequency of 50 kiloHertz (kHz) or more, preferably comprised between 10 Hz and 100 kHz, more preferably comprised between 10 kHz and 100 kHz or between 10 kHz and 50 kHz, and an output power density of $10^8$ Watt per square centimeter (W/cm$^2$) or more at the focusing point, that is to say at the waist of the laser.

Corresponding scanning speed of the vat is then about 50 cm/s to 5 m/s corresponding to a volume scanned of 10 to 300 millimeters cube per second, depending on the size of the waist of the laser beam. For instance, in the case of a waist diameter of 0.1 mm, the volume unit P is estimated to be equal to $4.2 \, 10^{-3}$ mm$^3$, so that, with a repetition frequency of 50 kHz and a scanning speed of 50 cm/s, the global volume scanned is equal to 210 mm$^3$ in one second (1 s) considering that each volume unit P that is scanned is adjacent to the volume unit P previously scanned.

The energy density of the pulse beam is for example 10 milliJoules (mJ) per pulse.

When the size of the waist of the laser beam is for example of diameter of 50 micrometer, the peak output is then about $10^8$ Watt per centimeter square (W/cm$^2$).

Preferably, peak output is comprised between $10^8$ and $10^{13}$ Watt per centimeter square, depending on the size of the waist of the laser beam.

The device 10 for implementing the method according to the invention also comprises a controlling unit 6 for controlling the laser source 1, the scanning device 2 and the focusing optical system 3.

The controlling unit 6 preferably comprises input means for inputting information required for control of the polymerization of the polymerizable material, for example a predetermined pattern and/or pathway.

By controlling the scanning means 2 and the focusing optical system 3, the laser beam can be scanned three-dimensionally in the XYZ directions, therefore triggering polymerization of the polymerizable material at any predetermined point of the vat.

This vat presents a size adapted to house the article to manufacture. It is filled with the polymerizable material. The dimensions of the vat could be up to a few ten centimeters. The vat is made of a material chemically resistant to the polymerizable material; that is to say of a material that is not reacting with the polymerizable material. It is for instance made of Teflon. The vat may be placed under or above the laser beam generation and scanning system. When it is placed above said laser beam generation and scanning system, the bottom of the vat is equipped with a window transparent to the laser beam.

This polymerizable material is in liquid form at ambient temperature, that is to say, between 15 and 25 degrees Celsius at least. By liquid form, it is meant that the polymerizable material is not solid. Preferably, the polymerizable material may be under the form of a viscous liquid.

Preferably, the polymerizable material exhibits a viscosity that ranges from 100 to 900 milliPascals seconds (mPa·s). The viscosity of the polymerizable material may for example be measured thanks to vibrational or rotational viscometers.

It is transparent at least in the 400-800 nanometers wavelengths range, that is to say it exhibits a transmittance higher than 85% for wavelengths in this range.

The polymerizable material comprises monomers adapted to polymerize into polymers, these monomers comprising for example molecules of one or several of the following compounds: vinyl-ether components, and/or an epoxy components, and/or other materials adapted to polymerize with a cationic mechanism such as oxetanes, olefins and episulfides.

Examples of molecules that can be polymerized with a cationic mechanism are given on FIGS. 5 to 27.

Figure 6:
Figure 7:
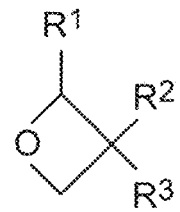
Figure 8:
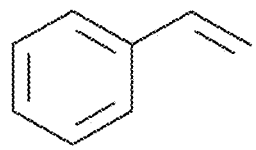
Figure 9:
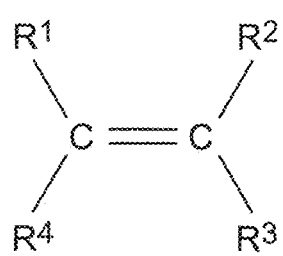

More precisely, FIG. 5 shows an epoxide, FIG. 6 shows a Vinyl ether, FIG. 7 shows an Oxetane, FIG. 8 shows the molecule of styrene and FIG. 9 shows an olefin. In FIGS. 5, 6, 7 and 9, the groups R, R$^1$, R$^2$, R$^3$ and R$^4$ can for instance be chosen within the followings: an atom of hydrogen, a phenyl group, an aromatic group, a carbon chain with between 1 to 10 atoms (possibly containing heteroatoms like oxygen O in it (then called ether), or sulfur S), or a more complex structure.

The monomers comprised in the polymerizable material could be mono or bi-functional. In practice, cycloaliphatic monomers have a higher reactivity compared to other epoxides.

Figure 10:
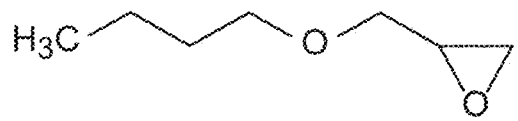
Figure 11:
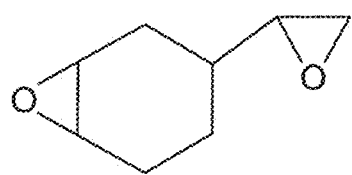
Figure 12:
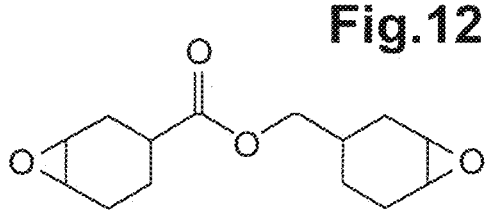
Figure 13:
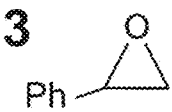
Figure 14:
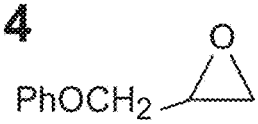
Figure 15:
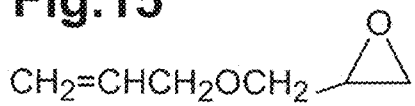
Figure 16:
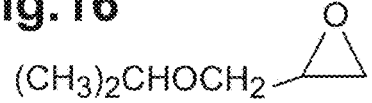
Figure 17:
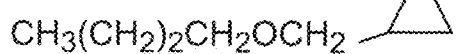
Figure 18:
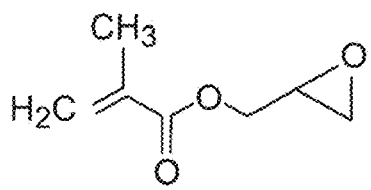
Figure 19:
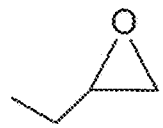
Figure 20:
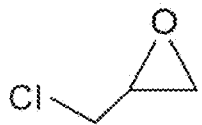
Figure 21:
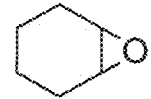
Figure 22:
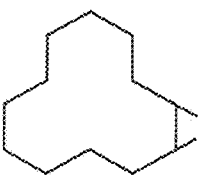

Some epoxides that could be comprised in the polymerizable material are given on FIGS. 10 to 12: FIG. 10 shows the molecule of butyl glycidyl ether (BGE), FIG. 11 shows the molecule of vinyl cyclohexene monoxide (VCM), and FIG. 12 shows the molecule of 3,4-epoxycyclohexylmethyl-3,4-epoxycyclohexane carboxylate (EEC). Some other epoxides that could be comprised in the polymerizable material are given on FIGS. 13 to 22.

Figure 23:
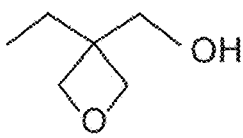
Figure 25:
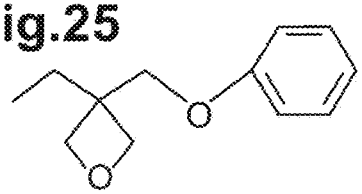
Figure 24:
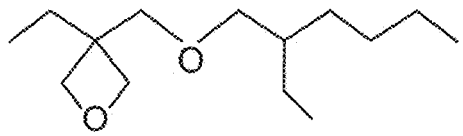
Figure 26:
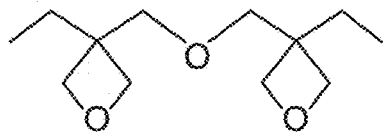
Figure 27:
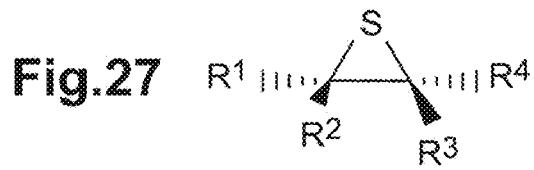

Some oxetane molecules that could be comprised in the polymerizable material are given on FIGS. 23 to 26: FIG. 23 shows the molecule of 3-ethyl-3-hydroxymethyl oxetane (OXA), FIG. 24 shows the molecule of 3-ethyl-3-phenoxymethyl oxetane (POX), FIG. 25 shows the molecule of 3-ethyl-3-[(2-ethylhexyloxy)methyl] oxetane (EHOX), and FIG. 26 shows the molecule of 3-ethyl-3 (3-ethyloxetane-3-yl) methoxy methyl oxetane (DOX).

At last, some episulfides could also be comprised in the polymerizable material. The developed formula of episulfides is given on FIG. 27, wherein R$^1$, R$^2$, R$^3$ and R$^4$ are similar as those given here above. Advantageously, episulfides often have a higher reactivity than the corresponding epoxides.

These components are the monomers that will polymerize in order to form the polymerized material.

The polymerizable material may comprise one or several of the precited compounds, in order to form homo- or co-polymers.

More precisely, in a possible implementation of the method according to the invention, the polymerizable material comprises, in weight relative to the total weight of said material, from 85% to 95% of epoxy monomers, from 15% to 5% of vinyl-ether monomers.

The polymerization of the polymerizable material is initiated by ionization of at least one molecule of said polymerizable material resulting from the irradiation by the laser beam.

Preferably, the polymerizable material exhibits a density that is close to the density of the polymerized material obtained after polymerization.

More precisely, the difference in density between the polymerizable material before polymerization and the polymerized material obtained after polymerization is less than 10% of the density of the polymerizable material. This aspect will be described in details hereafter.

The polymerizable material may also comprise appropriate additives in order to confine the reaction in a volume defined around the waist of the laser. For instance, the polymerizable material may contain inhibitors, such as tertiary amines, adapted to confine the reaction triggered by said laser beam, in the volume unit P.

Process

In a remarkable manner, according to the method of the invention, an article made of a polymerized material is manufactured according to the following steps:
- providing the vat of polymerizable material in liquid form, transparent at least in the 400-800 nanometers wavelengths range (block 100 of FIG. 2),
- irradiating said polymerizable material with the laser beam according to a predetermined pattern so as to polymerize said polymerizable material in order to form the article, the predetermined pattern being determined based on a three-dimension representation of said article with the positions in three dimensions of a plurality of volume units adapted to form together said article, the laser beam scanning the vat in three dimensions in order to be focused in the vat at each position of said volume units present in said predetermined pattern so as to initiate locally the polymerization of the polymerizable material at each of these positions (block 200 of FIG. 2).

After these two steps, the article made of polymerized material obtained is removed from the vat (block 300 of FIG. 2), and a subsequent heat treatment may be applied (block 400 of FIG. 2). Finally, the final article is obtained (block 500 of FIG. 2).

The predetermined pattern is determined to obtain the global shape and volume of the article in polymerized material at the end of the process.

The step of providing the vat has been already described in the description of the device used.

During said irradiation step, said laser beam scans the volume of the vat according to a predetermined pathway comprising a succession of said positions in three dimension of the volume units P of the polymerizable material to be irradiated according to said predetermined pattern, this pathway comprising positions of volume units to be irradiated that are distant from the positions of all the volume units having been irradiated before.

In other words, the pathway comprising the successive positions of the volume units P of the polymerizable material present in the vat irradiated by the laser beam is not continuous, in that it does not progress from the position of a volume unit of polymerizable material to an adjacent volume unit of polymerizable material.

It comprises at least some parts where the positions of two volume units successively irradiated are separate, apart from each other, so that these two volume units successively irradiated are not in contact.

Moreover, it comprises at least some parts where the positions of at least one volume unit irradiated is separate, apart from the positions of all the volume units of polymerized material, that is to say apart from all the volume units that have been previously irradiated following said pathway.

It is also possible to envisage that the pathway comprises dusters of adjacent volume units that are successively irradiated, forming clusters of volume units that are separate and apart from each other.

The article is thus manufactured through the polymerization of isolated volume units or isolated clusters of volume units.

The pathway used according to the method of the invention therefore allows a rapid, global building of the article as a whole.

Advantageously, said pathway allows the building of the article without a layer by layer process, and without the use of a building plate on which the first layer is placed.

Indeed, in the state of the art, the article is built on a building plate defining the base of the article. The volume units of the vat that are polymerized during a first scanning sequence are all in contact with this building plate. They form together the first layer. The volume units are polymerized on the building plate by moving said building plate in front of the laser beam. Once all the volume units to be irradiated situated adjacent to, in contact with, the building plate have been irradiated, the second scanning sequence begins. The second scanning sequence focuses the laser beam on volume units whose positions are adjacent to, in contact with, the first layer. The building plate is moved again so that these volume units are placed in front of the laser beam to get irradiated. The volume units of the second scanning sequence that are polymerized form together the second layer. In the state of the art, the article is thus built layer by layer, by adding one layer of polymerized material on the previously formed layer.

According to the invention, there is no privileged direction for building the article, no moving building plate, and no layer. Consequently, the irregularities of the articles manufactured through classical additive manufacturing occurring layer by layer are avoided. In particular, there is no mechanical movement inside the vat so no constraints are applied to the article under construction: there is no peeling of layers, there is no layer, there is no creation of bubbles inside the vat.

In the present invention, different types of pathways may be envisaged.

The pathway may lead to building the article from the inside to the outside, or from the outside to the inside. It may be build from the reunion of different parts of the article that are initially built apart from each other and grow until they meet to form the article. These types of pathway are preferably used when the volume units that are polymerized have little or no displacement inside the volume of the vat during the irradiation step.

The article could also be built from the bottom to the top for instance.

Said irradiation step comprises a predetermined number of successive scanning sequences, during each of which the laser beam scans the vat according to a part of said predetermined pathway, this part comprising the positions of a plurality of volume units positioned in a part of or in the whole volume of the article.

Preferably, at least two scanning sequences are defined so that the laser beam scans the vat according to a common part of the predetermined pathway. In other words, at least two scanning sequences partially overlap each other so that some volume units of the vat are irradiated at least twice by the laser beam, during two different scanning sequences, successively or not.

Preferably, at least two scanning sequences overlap so that globally, with this two scanning sequences, the laser beam scans a global network of volume units included in the predetermined pattern (but not necessarily every single volume unit of the predetermined pattern). In other words, with this two scanning sequences, the main volume units of the predetermined pattern are irradiated by the laser beam so as to give its global shape to the article. For instance, about 95% of all the volume units of the predetermined pattern are irradiated at least once by the laser beam during this two scanning sequences.

The article may be built from a plurality of scanning sequences where the laser beam scans the whole volume of the article from the centre to the periphery of the article, or from the periphery to the centre.

It may also be built from scanning sequences alternatively building different parts of the article, until these parts are joined. The last scanning sequences could then scan the whole volume of the article.

It may also be built from scanning sequences where the laser beam scans the vat from top to bottom or from bottom to top, or where the whole volume of the vat is scanned in each sequence but with a translation of 1 volume unit from a sequence to another.

Any variant or combination of the above sequences may be envisaged.

Advantageously, at least one scanning sequence scans the whole volume of the article.

Advantageously, each scanning sequence comprises a predetermined number of positions of the pattern to be scanned.

Advantageously, each scanning sequence starts in a predetermined region of the article to be manufactured.

Each scanning sequence could be defined by a period of time during which the laser beam scans the vat according to said part of predetermined pathway. The scanning sequence could also be defined by a starting instant and an end instant that correspond to the laser beam being focused on predetermined positions in the vat.

For instance, the starting instant of a given further scanning sequence can be defined by a first occurrence of irradiating a volume unit which position in three dimensions is comprised in-between at least 2 or 3 volume units or clusters of volume units that were irradiated during the directly previous scanning sequence. Conversely a given scanning sequence can be considered finished as soon as is irradiated a volume unit which position is comprised in-between at least 2 or 3 volume units or clusters of volume units that were irradiated during said given scanning sequence.

In particular, the starting instant of the second scanning sequence can be defined by a first occurrence of irradiating a volume unit which position is in-between at least 2 or 3 volume units or clusters of volume units that were irradiated previously that is to say during the first scanning sequence, while the starting instant of the third scanning sequence can be defined by a first occurrence of irradiating a volume unit which position is in-between at least 2 or 3 volume units or clusters of volume units that were irradiated during the second scanning sequence, that is to say from the starting instant of the second scanning sequence. Thus, during a given scanning sequence (for example the third scanning sequence) some volumes units which position is in-between at least 2 or 3 volume units or clusters of volume units that were irradiated during previous scanning sequences (the first and second scanning sequences in this example) may be irradiated without this counting as starting a further scanning sequence (a fourth scanning sequence in this example).

Preferably, during at least one of said scanning sequences, at least one volume unit or a cluster of volume units irradiated by the laser beam is apart from any other volume unit or cluster of volume units irradiated by the laser beam during the same scanning sequence. It is isolated from the other volume units or clusters of volume units irradiated.

Therefore, the corresponding scanning sequence is different from a sequence where a layer of the article is scanned.

In possible embodiments, the positions of the volume units of the pathway of the laser beam are determined step by step. More precisely, the positions of the volume units to be irradiated during a given scanning sequence are determined based on the positions of the volume units irradiated during the previous scanning sequences.

For example, the positions of the volume units to be irradiated during a given scanning sequence are determined to be in between the positions of the volume units irradiated during one or several previous scanning sequences.

In such a possible embodiment, during a first sequence of said scanning sequences, the laser beams irradiates a first set of volume units of the vat, and, during the following scanning sequence, the laser beams irradiates a second set of volume units, each volume units of the second set of volume units being situated in between a plurality of the volume units of the first set.

For example, the volume units irradiated during the second scanning sequence are positioned on the segments linking two volume units irradiated successively during the first scanning sequence.

According to another example, the volume units irradiated during the second scanning sequence are positioned inside a triangle or inside a tetrahedron linking three or four volume units irradiated during the first scanning sequence, or during one or several previous scanning sequence.

This embodiment is illustrated on FIGS. 3 and 4.

FIG. 3 shows a schematic representation of an article to be built according to the method of the invention. It is here a presentation lens.

FIG. 4 shows schematically the position of the volume units scanned during four successive scanning sequences, in a radial cross-section view of the lens:
- the positions of the volume units scanned during a first scanning sequence are represented by crosses,
- the positions of the volume units scanned during a second scanning sequence are represented by circles,
- the positions of the volume units scanned during a third scanning sequence are represented by squares,
- the positions of the volume units scanned during a fourth scanning sequence are represented by triangles.

The volume units irradiated during the second sequence (circles) are positioned in between the volume units irradiated during the first scanning sequence (crosses), for example in the middle of each segment linking the positions of two volume units successively irradiated during the first scanning sequence.

The volume units of the first and second scanning sequences are positioned at the front and back face of the presentation lens to be built.

The volume units irradiated during the third scanning sequence (squares) are then positioned relative to the volume units of the first and second scanning sequences: they are positioned inside the lens volume, spaced apart from the volume units of the first and second scanning sequences by a given distance, and here placed at right angles to the front face of the lens, level with the volume units of the second scanning sequence.

The volume units irradiated during the fourth scanning sequence are then positioned relative to the volume units of the first and third scanning sequences: they are positioned inside the triangles defined by the volume units of the first and third scanning sequences, in the cross-section view.

In the current example, the positions of the volume unit to be irradiated in each sequence are similar in each radial cross-section views of the lens.

The building of the lens may progress from the front and back face towards the inside of the lens, until the volume of the lens is filled.

It may also progress from one external face to the other, or from the inside of the lens to the outside.

In practice, the laser beam irradiates the polymerizable material with a wavelength adapted to trigger its polymerization.

The polymerization of the monomers contained in the volume unit irradiated at each position of the pathway, during a predetermined time, may be only partial.

Preferably, the irradiation parameters, that is to say, duration of the irradiation, power of the laser pulses, number of scanning sequences, number of scanning occurrence of a given volume unit, wavelength of the laser, are adjusted in order to trigger polymerization of at least 10% of the monomers contained in each volume unit.

According to another embodiment of the method of the invention, at least one volume unit irradiated by the laser beam during a given scanning sequence was already irradiated by the laser beam during a previous scanning sequence.

It is therefore possible to irradiate the same volume unit several times, in order to increase the proportion of monomers having reacted in this volume unit.

When the polymerization of the polymerizable material is not complete at the end of the irradiation step, an additional step of heat treatment (block 400 of FIG. 2) of the article may be performed in order to obtain the final article. This heat treatment is applied after the article has been removed from the vat (block 300 of FIG. 2).

Alternatively, when the polymerization of the polymerizable material is not complete at the end of the irradiation step, an additional step of curing by UV-light could also be performed to obtain the final article.

During said irradiation step, said laser beam scans the volume of the vat at a frequency ranging from ten (10 Hz) to hundred thousand (100 kHz) positions, preferably ranging from ten thousand (10 kHz) to fifty thousand (50 kHz) positions of the predetermined pathway per second.

Preferably, each pulse of the laser beam hits a different volume unit of the polymerizable material in the vat.

Said irradiation step lasts between 1 second to 30 minutes.

The laser beam is pulsed with pulses lasting between 1 nanosecond (ns) and 50 ns and has an energy higher than or equal to 10 milliJoules per pulse, or $10^8$ W/cm$^2$.

The laser beam irradiates the polymerizable material with a wavelength adapted to trigger its polymerization, in the 250 to 400 nm range or 1 micrometer to 4 micrometers range.

The polymerization of the polymerizable material is initiated by ionization of at least one molecule of said polymerizable material resulting from the irradiation by the laser beam.

It is here a photopolymerization by ionic chain reaction, in particular by cationic mechanism with the molecules comprised in the polymerizable material as described previously.

More precisely, the polymerization of the polymerizable material may be initiated by laser induced ionization, for example cationic ionization, anionic ionization or ionization through radicals, or by formation of a plasma in the polymerizable material inducing ionization and polymerization through a cationic mechanism.

In the case where the polymerization is triggered by laser induced ionization, the polymerizable material preferably comprises a photoinitiator. The photoinitiator is a chemical compound that absorbs the radiation having the wavelength of the laser beam and breaks up to provide a reactive species that reacts with other component of the polymerizable material, such as the monomers, to starts the chain reaction that will formed the polymerized material.

The reactive species may be ionic species, especially cationic species.

The polymerization of the polymerizable material may also be triggered by a plasma formed locally at the waist of the laser beam.

This is possible thanks to the high peak power of the laser beam.

In this case, the polymerizable material does not necessarily contain a photoinitiator. This reduces the cost of the polymerizable material, and the complexity of its composition.

The reaction is then a cationic chain reaction.

The advantage of the method of the invention is to build an article in three dimensions in a very short time by polymerization of a polymerizable material. Thanks to the high scanning speed of the laser beam, the polymerizable material is quickly polymerized and therefore solidified in order to build the article.

As mentioned before, the polymerizable material placed in the vat advantageously exhibits a density that is close to the density of the polymerized material obtained after polymerization. This advantageously limits the drift of the polymerized volume units in the vat, that is to say the movement of the polymerized volume units during the rest of the irradiation step.

This movement is due to the difference in weight between the volume unit of polymerizable material before polymerization and the weight of the volume unit of polymerized material after polymerization. This difference in weight may cause the volume unit of polymerized material to sink toward the bottom of the vat because of the gravity when the density of the polymerized material is higher than the density of the polymerizable material or to be driven toward the upper part of the vat because of the Archimedean buoyant force, when the density of the polymerized material is smaller than the density of the polymerizable material.

The difference in density between the polymerizable material before polymerization and the polymerized material obtained after polymerization is advantageously less than 10% of the density of the polymerizable material.

The movement of the volume units of polymerized material is then limited.

Moreover, the viscosity of the polymerizable material is also optimized in order to reduce the movement of the volume units of polymerized material in the vat of polymerizable material. As mentioned before, the polymerizable material presents advantageously a high viscosity.

Advantageously, during a given scanning sequence, the actual positions in the vat of the volume units of polymerized material that have been irradiated by the laser beam during the previous scanning sequences are determined through measurements and/or calculations, preferably through calculations as they are more versatile and cheaper than measurements.

The actual positions in the vat of the volume units of the vat having been irradiated by the laser beam during the previous scanning sequences is preferably determined continuously or at predetermined intervals of time during the given scanning sequence or the whole irradiation step.

The actual positions at different instants may be compared to determine the movement of the volume units of polymerized material.

This allows following the movement of the volume units of polymerized material during the remaining duration of the scanning sequence.

Preferably, the movement of each volume unit of polymerized material is determined during the whole irradiation step.

Alternatively, the movement of clusters of volume units of polymerized material is determined. These clusters regroup volume units that have been polymerized in a given time frame and/or in a given area of the vat.

Based on the actual positions determined for the volume units of polymerized material and/or on the movements of these volume units, the predetermined pattern and/or the predetermined pathway of the laser beam may be modified.

For instance, said predetermined pathway is modified by taking into account the actual positions of the volume units of the vat having been irradiated by the laser beam during the previous scanning sequences, said actual positions being drifted compared to the initial one (where the volume unit were hit by the laser beam for the first time).

This modification may be performed in real time, during the irradiation step, to take into account the drift of the polymerized volume units.

The modification of the predetermined pathway and/or pattern is performed so that the expected final shape and size of the article is obtained at the end of the irradiation step.

Alternatively, the change in the positions in the vat of each volume unit of the vat having been irradiated by the laser beam may be predicted through calculations.

In this case, for example, first predetermined pattern and/or pathway for manufacturing the article is determined without taking into account the drift of the volume units of polymerized material. Then, a second corrected pattern/or pathway is determined based on the first predetermined pattern and/or pathway, on the parameters of the laser, such as frequency of the pulses, speed of the movements of the laser beam and on the predicted change in the positions in the vat of each volume unit of polymerized material.

Said predetermined pattern and/or pathway is determined taking into account the change in the position of the volume units of polymerized material, in order for the volume units of polymerized material to form together said article at the end of the irradiation step.

Alternatively, a first predetermined pattern and/or pathway for manufacturing the article could be determined without taking into account the drift, and a second corrected pattern/or pathway could be determined based on the first predetermined pattern and/or pathway so as to anticipate the future drifts of the volume units (knowing they will drift once they get polymerized). The second corrected pattern/or pathway would hence comprise the position of the volume units as if they were initially misplaced but so that they would reach their appropriate position at the end of the irradiating step, in the final article.

As a variant, in order to counteract the effect of gravity on the volume units of polymerized material, pillars may be built from the bottom of the vat to support parts of the article while it is being built.

The invention claimed is:

1. A method for manufacturing an article made of a polymerized material, the method comprising:
providing a vat of polymerizable material, the polymerizable material being transparent at least in a 400-800 nanometers wavelengths range; and
irradiating said polymerizable material with a laser beam according to a predetermined pattern to polymerize said polymerizable material in order to form the article according to a predetermined number of successive scanning sequences, the predetermined pattern being determined based on a three- dimension representation of said article with positions in three dimensions of a plurality of volume units configured to form together said article, the laser beam scanning the vat in three dimensions in order to be focused at each of the positions of said volume units present in said predetermined pattern to initiate locally polymerization of the polymerizable material at each of the positions,
during the irradiating each of the successive scanning sequences, said laser beam scanning a volume of the vat according to a predetermined pathway comprising a succession of said positions of the volume units to be irradiated according to said predetermined pattern, the predetermined pathway comprising a position of each of the volume units to be irradiated that is not continuous with respect to a position of each of adjacent volume units of the volume units that have been previously irradiated,
wherein during one successive scanning sequence of said successive scanning sequences, the laser beam irradiates a first set of volume units of the vat, and during at least one following successive scanning sequence of said successive scanning sequences, the laser beam irradiates a second set of volume units, each volume unit of the second set of volume units being situated in between the first set of volume units, and
wherein at least some volume units of the second set of volume units are not in contact with other adjacent volume units that have been previously irradiated.

2. The method according to claim 1, wherein the laser beam scans the vat according to a part of said predetermined pathway during each of the predetermined number of successive scanning sequences, the part comprising positions of a plurality of volume units positioned in a part of or in a whole volume of the article.

3. The method according to claim 2, wherein, during at least one of said successive scanning sequences, at least one volume unit or a cluster of volume units irradiated by the laser beam is not in contact with any other volume unit or cluster of volume units irradiated by the laser beam during the same scanning sequence.

4. The method according to claim 2, during another successive scanning sequence of said successive scanning sequences, which is immediately following the at least one following successive scanning sequence, the laser beam irradiates volume units situated in between two volume units of the first set of the volume units.

5. The method according to claim 2, wherein at least one of the volume units irradiated by the laser beam during a specific scanning sequence of the successive scanning sequences was irradiated by the laser beam during a previous scanning sequence.

6. The method according to claim 2, wherein, during a specific scanning sequence of the successive scanning sequences, actual positions of the volume units in the vat having been irradiated by the laser beam during a previous successive scanning sequence of the successive scanning sequences are determined through one or more among measurements and calculations.

7. The method according to claim 6, wherein, said predetermined pathway is modified by taking into account the actual positions of the volume units of the polymerized material having been irradiated by the laser beam during the previous scanning sequences.

8. The method according to claim 1, wherein, during the irradiating, said laser beam scans a volume of the vat at a frequency ranging from ten (10 Hz) to hundred thousands (100 kHz) positions of the predetermined pathway per second.

9. The method according to claim 1, wherein the irradiating lasts between 1 second and 30 minutes.

10. The method according to claim 1, wherein the laser beam is pulsed with pulses lasting between one nanosecond (1 ns) and fifty nanoseconds (50 ns), the laser beam having an energy greater than or equal to 10 milliJoules per pulse, or 108 W/cm$^2$.

11. The method according to claim 1, wherein the laser beam irradiates the polymerizable material with a wavelength configured to trigger polymerization of the polymerizable material, in the 250 to 400 nm range or in the 1 micrometer to 4 micrometers range.

12. The method according to claim 1, wherein the polymerizable material comprises one or more of the group consisting of a vinyl-ether component, an epoxy component, and a material configured to polymerize with a cationic mechanism.

13. The method according to claim 1, wherein the polymerizable material comprises, in weight relative to the total weight of said material,
from 85% to 95% of epoxy components, and
from 15% to 5% of vinyl-ether components.

14. The method according to claim 1, wherein the polymerizable material exhibits a viscosity that ranges from 100 to 900 milliPascals seconds (mPa.s) at ambient temperature.

15. The method according to claim 1, wherein the polymerization of the polymerizable material is initiated by ionization of at least one molecule of said polymerizable material resulting from the irradiation by the laser beam.

16. The method according to claim 1, wherein the polymerizable material exhibits a density that is close to the density of the polymerized material obtained after polymerization, the difference in density between the polymerizable material before polymerization and the polymerized material obtained after polymerization being less than 10% of the density of the polymerizable material.

17. The method according to claim 1, wherein a change in each of the positions of the volume units having been irradiated by the laser beam is predicted through calculations.

18. The method according to claim 17, wherein said predetermined pattern is determined taking into account the change in each of the positions of the volume units having been irradiated by the laser beam, in order for the volume units having been irradiated by the laser beam to form together said article at the end of the irradiating.

19. The method according to claim 1, wherein clusters of volume units are formed that are separate and apart from each other by successively irradiating the volume units along the pathway.

20. The method according to claim 1, wherein the article is formed without a layer-by-layer process.

* * * * *